(12) United States Patent
Stirk et al.

(10) Patent No.: US 9,413,354 B2
(45) Date of Patent: Aug. 9, 2016

(54) METHOD FOR COMMUNICATION ACROSS VOLTAGE DOMAINS

(71) Applicant: Apple Inc., Cupertino, CA (US)

(72) Inventors: Gary L. Stirk, West Melbourne, FL (US); Karthik Kadirvel, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/705,479

(22) Filed: May 6, 2015

(65) Prior Publication Data

US 2016/0182047 A1    Jun. 23, 2016

Related U.S. Application Data

(60) Provisional application No. 62/096,323, filed on Dec. 23, 2014.

(51) Int. Cl.
*H03K 5/08*    (2006.01)
*H03K 19/0175*    (2006.01)

(52) U.S. Cl.
CPC .............................. *H03K 19/017509* (2013.01)

(58) Field of Classification Search
None
See application file for complete search history.

(56) References Cited

U.S. PATENT DOCUMENTS

| | | | |
|---|---|---|---|
| 6,636,087 B2 * | 10/2003 | Miyazaki | H03K 17/166 327/108 |
| 7,420,431 B2 | 9/2008 | Hwang et al. | |
| 7,679,324 B2 | 3/2010 | Xiao et al. | |
| 8,451,306 B2 | 5/2013 | Nagumo | |
| 2008/0091363 A1 | 4/2008 | Tae | |
| 2010/0173183 A1 | 7/2010 | Kadirvel et al. | |
| 2011/0298541 A1 * | 12/2011 | Shi | H03F 3/45708 330/261 |
| 2014/0125274 A1 | 5/2014 | Kim | |
| 2015/0188543 A1 * | 7/2015 | Jain | H03K 5/1565 327/333 |

FOREIGN PATENT DOCUMENTS

| | | |
|---|---|---|
| DE | 102013100799 | 6/2014 |
| EP | 2485293 | 8/2012 |

OTHER PUBLICATIONS

International Search Report and Written Opinion in application No. PCT/US2015/055405 issued Jan. 28, 2016.

* cited by examiner

*Primary Examiner* — Long Nguyen
(74) *Attorney, Agent, or Firm* — Meyertons, Hood, Kivlin, Kowert & Goetzel, P.C.

(57) ABSTRACT

A system may include a plurality of units, wherein each unit has a respective common mode voltage terminal, communication up terminal, and communication down terminal. A first unit of the plurality of units may be configured to generate a first plurality of currents on its communication up terminal, wherein the first plurality of currents corresponds to a first plurality of bits. A second unit of the plurality of units may be configured to receive the first plurality of currents on its respective communication down terminal, and maintain a voltage level at its respective communication down terminal during reception of the first plurality of currents. The voltage level may be equal to a common mode voltage of the respective common mode voltage terminal of the second unit.

20 Claims, 6 Drawing Sheets

METHOD FOR COMMUNICATION ACROSS VOLTAGE DOMAINS

PRIORITY CLAIM

The present application claims benefit of priority to U.S. Provisional Application No. 62/096,323, filed on Dec. 23, 2014, which is hereby incorporated by reference in its entirety as though fully and completely set forth herein. In the event any statements seemingly conflict, then the statements disclosed in the present application supersede the conflicting statements disclosed in U.S. Provisional Application No. 62/096,323.

BACKGROUND

1. Technical Field

Embodiments described herein are related to the field of integrated circuits, and more particularly to a communication circuit to communicate between integrated circuits.

2. Description of the Related Art

Computing systems may include one or more systems-on-a-chip (SoCs), which may integrate a number of different functions, such as, application execution, graphics processing and audio processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Various computing systems may include multiple voltage domains, i.e., different circuits powered by different power supplies which may have different power supply voltage levels and/or different common mode voltage levels (also commonly referred to as "ground reference," "voltage grounds,"0 or simply "grounds"). In some systems, to communicate from an SoC or other type of integrated circuit (IC) in one voltage domain to an IC in another voltage domain, communication signals must pass through a level shifter, i.e., a circuit designed to convert signals from the first voltage domain into an equivalent signal in the other voltage domain. Some drawbacks of level shifters, in various embodiments, are consumption of additional power, taking space on a circuit board or IC, and adding delays to the signals being level shifted.

SUMMARY OF THE EMBODIMENTS

Various embodiments of a communication circuit are disclosed. Broadly speaking, a system, an apparatus, and a method are contemplated in which the system may include a plurality of units, wherein each unit of the plurality of units has a respective common mode voltage terminal, a respective communication up terminal, and a respective communication down terminal. A first unit of the plurality of units may be configured to generate a first plurality of currents on the respective communication up terminal of the first unit, wherein each current of the first plurality of currents corresponds to a respective bit of a first plurality of bits. A second unit of the plurality of units may be configured to receive the first plurality of currents on the respective communication down terminal of the second unit, and to maintain a voltage level at the respective communication down terminal of the second unit during reception of the first plurality of currents. The voltage level may be equal to a common mode voltage of the respective common mode voltage terminal of the second unit.

In a further embodiment, a respective supply voltage terminal of the first unit may be coupled to a positive terminal of a first power supply, and the respective common mode voltage terminal of the second unit may be coupled to the positive terminal of the first power supply. In another embodiment, the second unit may be further configured to generate a second plurality of currents on the respective communication down terminal of the second unit, wherein each current of the second plurality of currents corresponds to a respective bit of a second plurality of bits.

In an embodiment, the first unit may be further configured to receive the second plurality of currents on the respective communication up terminal of the first unit, and to maintain a respective voltage level of the respective communication up terminal of the first unit during reception of the second plurality of currents. The respective voltage level may be equal to a supply voltage level of a respective supply voltage terminal of the first unit.

In another embodiment, the respective communication up terminal of the second unit is coupled to the respective communication down terminal of a third unit of the plurality of units. The third unit may be configured to receive the first plurality of currents on the respective communication down terminal of the third unit, and to maintain a respective voltage level of the respective communication down terminal of the third unit during reception of the first plurality of currents. The respective voltage level of the respective communication down terminal may be equal to a common mode voltage of the respective common mode voltage terminal of the third unit.

In a further embodiment, the first plurality of bits may include at least one command for the second unit. In another embodiment, each bit of the first plurality of bits may correspond to a respective logic state of a clock signal.

BRIEF DESCRIPTION OF THE DRAWINGS

The following detailed description makes reference to the accompanying drawings, which are now briefly described.

Figure 1:
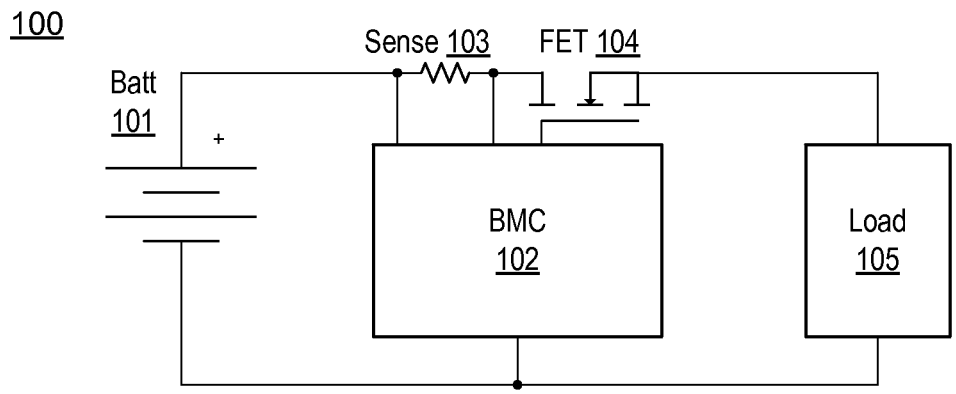
FIG. 1 illustrates an embodiment of a battery management system with a single battery cell.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Portable devices may utilize one or more battery cells for providing power to the circuits of the device. Each battery cell includes a positive and negative terminal capable of providing voltage and current to one or more of the circuits. In some devices, battery management circuits may be used to monitor and manage the performance of the battery cells. Some such devices may use a single management circuit to manage the battery cells while other devices may use one management circuit for each battery cell. In cases in which multiple battery management circuits are used, each circuit may receive power only from the battery cell it is monitoring. Providing a dedicated management circuit to each battery cell may provide advantages such as allowing the circuit to be placed adjacent to or even within a package of the cell. A dedicated management circuit could, however, make communication between the management circuits problematic since the battery cells may have different voltage levels at any given time. In addition, battery cells arranged in series will result in each coupled management circuit having a different common mode voltage level than the other management circuits. Such issues might require additional circuits for level shifting signals between two battery management circuits.

A communication circuit is disclosed herein which may allow signals to travel between two or more management circuits without a need for intermediate level shifting by additional circuitry, allowing each management circuit to process signals within its respective voltage domain. The disclosed communication circuit may provide a method for enabling bi-directional communication between circuits in multiple voltage domains.

It is noted that, although battery management circuits are used herein to demonstrate the disclosed concepts, these concepts may apply to other types of circuits as well. For example, the concepts may apply to circuits such as a processor and a memory, a sensor and a control unit, an input device and a computing system, or any two or more circuits requiring a communications channel.

Many terms commonly used in reference to IC designs are used in this disclosure. For the sake of clarity, the intended definitions of some of these terms, unless stated otherwise, are as follows:

A Metal-Oxide-Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor3 s threshold voltage is applied between the gate and the source. P-channel MOSFETs open a conductive path when a voltage greater than the transistor's threshold voltage is applied between the drain and the gate.

Complementary MOSFET (CMOS) describes a circuit designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. While CMOS logic is used in the examples described herein, it is noted that any suitable logic process may be used for the circuits described in embodiments described herein.

It is noted that "logic 1", "high", "high state", or "high level" refers to a voltage sufficiently large to turn on a n-channel MOSFET and turn off a p-channel MOSFET, while "logic 0", "low", "low state", or "low level" refers to a voltage that is sufficiently small enough to do the opposite. In other embodiments, different technology may result in different voltage levels for "low" and "high."

It is also noted that, as used herein, the term "common mode voltage" refers to voltage applied to a ground node or terminal of a given circuit. "Common mode voltage" may also be referred to as "ground reference," "voltage ground," or simply "ground" in respect to the given circuit. Two circuits with different common mode voltages may include additional circuitry, such as level shifting circuits, in order to share a typical voltage driven signal.

The embodiments illustrated and described herein may employ CMOS circuits. In various other embodiments, however, other suitable technologies may be employed.

A block diagram of a system including a battery and battery management circuit is shown in FIG. 1. System 100 includes battery (batt) 101, battery management circuit (BMC) 102, sensor element (sense) 103, and load 105. System 100 may correspond to a portion of a portable computing system, such as a laptop computer, smartphone, tablet or wearable device.

Battery 101 may be a single battery cell or a plurality of battery cells coupled together to produce a single output voltage. In various embodiments, battery 101 may be rechargeable or disposable. In the present embodiment, battery 101 provides power to load 105 and to BMC 102.

BMC 102 manages the performance of battery 101 by measuring and tracking current supplied by battery 101 to load 105. If battery 101 is rechargeable, BMC may also measure and track a recharging current into battery 101. BMC 101 may maintain operational or statistical information regarding battery 101 such as, for example, an amount of charge used/remaining, an average current supplied, a peak current supplied, a number of charging cycles battery 101 has undergone, and an elapsed time for a current charging cycle. BMC 102 may be communicatively coupled to a processor in system 100 (not shown) to receive commands from the processor and to provide the maintained battery information to the processor.

BMC 102 measures current using sensor element 103. Sensor element 103 may be a resistor, inductor, or other component or circuit capable of sensing a direction and amount of current flowing in a supply line from battery 101 to load 105. BMC 102 may measure a voltage on either side of sensor element 103 and convert the voltage measurements to a corresponding magnitude and direction of current.

BMC 102 also turns FET 104 on and off. FET 104 may be used as a power switch to allow current to pass from battery 101 to load 105 or to disable circuits included in load 105. In a rechargeable system, BMC 102 may also turn FET 104 on to allow recharging of battery 101. Current from battery 101 may flow through sensor element 103 whenever FET 104 is turned on, either for supplying power from battery 101 or for charging battery 101. Although FET 104 is illustrated and described as a field effect transistor, in other embodiments, FET 104 may be implemented as a bipolar junction transistor (BJT), a junction gate field-effect transistor (JFET), or any other suitable type of transistor. In some embodiments, FET 104 may correspond to multiple transistors.

Load 105 represents any circuit or circuits receiving power from battery 101. In various embodiments, load 105 may be a single IC, a complete portable computing device, or a portion of a computing device. Load 105, may, in embodiments in which battery 105 is rechargeable, include circuits for relaying a recharging current to battery 101.

It is noted that system 100 of FIG. 1 is merely an example. Other embodiments may include more components. For example, BMC 102 may measure more than one sensor element in order to monitor multiple power supply lines from battery 101 to multiple loads.

Figure 2:
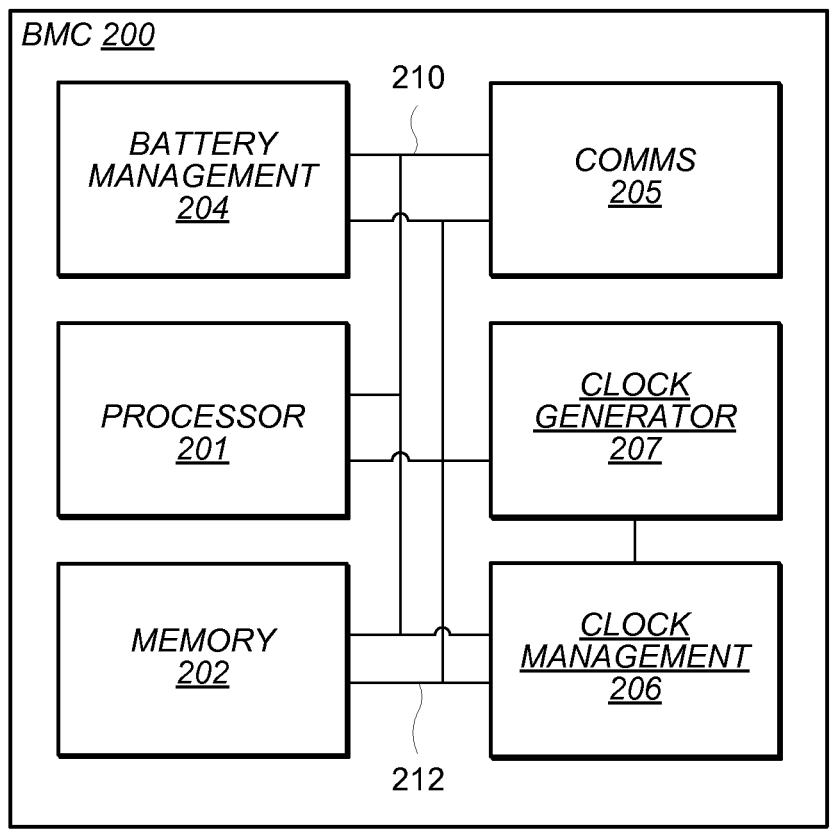
FIG. 2 illustrates an embodiment of a block diagram of a battery management circuit.

Moving to FIG. 2, a block diagram of an embodiment of an battery management circuit (BMC) is illustrated. In the illustrated embodiment, BMC 200 includes processor 201 coupled to memory block 202, battery management unit 204, communication block 205, clock management unit 206, all coupled through bus 210. Additionally, clock generator 207 may be coupled to clock management unit 206 and provide one or more clock signals 212 to the functional blocks in BMC 200. In some embodiments, BMC 200 corresponds to BMC 102 in FIG. 1.

Processor 201 may, in various embodiments, be representative of a general-purpose processor that performs computational operations. For example, processor 201 may be a central processing unit (CPU) such as an embedded processor, a microcontroller, an application-specific integrated circuit (ASIC), or a field-programmable gate array (FPGA). In some embodiments, processor 201 may include multiple CPU cores and may include one or more register files and memories.

In various embodiments, processor 201 may implement any suitable instruction set architecture (ISA), such as, e.g., ARM Cortex, PowerPC™, or x86 ISAs, or combination thereof. Processor 201 may include one or more bus transceiver units that allow processor 201 to communicate to other functional blocks via bus 210, such as, memory block 202, for example.

Memory block 202 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM). Some embodiments may include a single memory, such as memory block 202 and other embodiments may include more than two memory blocks (not shown). In various embodiments, memory block 202 may be configured to store program instructions that may be executed by processor 201, store data to be processed, such as graphics data, or a combination thereof.

Battery management unit 204 includes circuits to manage the performance of a battery coupled to BMC 200. Battery management unit 204 may include one or more analog-to-digital converters (ADCs) for measuring voltage levels of sensors, such as, e.g., sensor element 103 in FIG. 1. Battery management unit 204 may include additional circuits for measuring temperature, measuring charge/coulombs, and controlling charging of the coupled battery.

Communication block 205 includes circuits for communicating with other ICs. Communication block may include circuits for supporting multiple communication protocols, such as, for example, inter-integrated circuit ($I^2C$), universal asynchronous receiver/transmitter (UART), and serial peripheral interface (SPI). In addition, communication block 205 includes support for a communication protocol that enables signals to be transmitted and received across two or more voltage domains. The additional protocol may provide communication support between two or more BMCs, each coupled to and powered by separate batteries. This additional communication protocol will be explained in more detail below.

Clock management unit 206 may be configured to enable, configure and monitor outputs of one or more clock sources. In various embodiments, the clock sources may be located in clock generator 207, communication block 205, within clock management unit 206, in other blocks within BMC 200, or come from an external signal coupled through one or more input/output (I/O) pins. In some embodiments, clock management 206 may be capable of configuring a selected clock source before it is distributed throughout BMC 200. Clock management unit 206 may include circuits for synchronizing an internal clock source to an external clock signal.

Clock generator 207 may be a separate module within BMC 200 or may be a sub-module of clock management unit 206. One or more clock sources may be included in clock generator 207. In some embodiments, clock generator 207 may include PLLs, FLLs, DLLs, internal oscillators, oscillator circuits for external crystals, etc. One or more clock signal outputs 212 may provide clock signals to various functional blocks of BMC 200.

System bus 210 may be configured as one or more buses to couple processor 201 to the other functional blocks within the BMC 200 such as, e.g., memory block 202, and I/O block 203. In some embodiments, system bus 210 may include interfaces coupled to one or more of the functional blocks that allow a particular functional block to communicate through the bus. In some embodiments, system bus 210 may allow movement of data and transactions (i.e., requests and responses) between functional blocks without intervention from processor 201. For example, data received through the I/O block 203 may be stored directly to memory block 202.

It is noted that the BMC illustrated in FIG. 2 is merely an example. In other embodiments, different functional blocks and different configurations of functions blocks may be possible dependent upon the specific application for which the BMC is intended.

Figure 3:
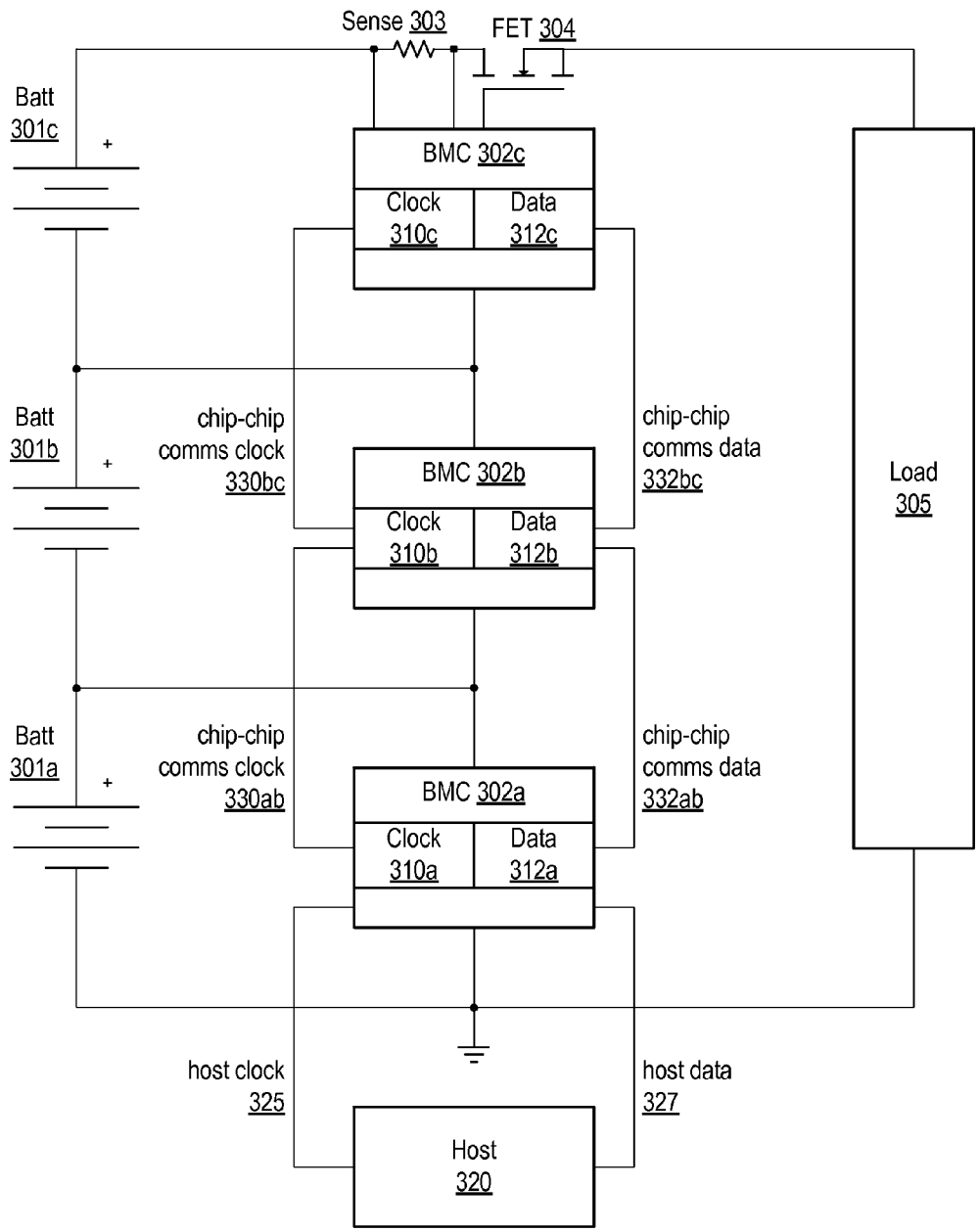
FIG. 3 shows an embodiment of a battery management system with multiple battery cells.

Turning to FIG. 3, an embodiment of a block diagram of a battery management system with multiple battery cells is illustrated. The illustrated embodiment of system 300 includes batteries 301*a-c*, battery management circuits (BMCs) 302*a-c*, sensor element (sense) 303, field-effect transistors (FET) 304, load 305, and host 320. Each BMC 302 includes a corresponding clock circuit 310 and data circuit 312. System 300 also includes signals host clock 325, host data 327, chip-to-chi communications (comms) clocks 330*ab* and 330*bc*, chip-to-chip comms data 332*ab* and 332*bc*. Similar to system 100 of FIG. 1, system 300 may correspond to a portion of a portable computing system, such as a laptop computer, smartphone, tablet or wearable device.

Batteries 301a-c provide power to circuits included in load 305. In the present embodiment, batteries 301a-c are rechargeable, while they may be disposable in other embodiments. Batteries 301a-c are arranged in series and battery 301a may be referred to herein as the "bottom cell," battery 301b referred to as the "middle cell," and battery 301c referred to as the "top cell." In some embodiments, each cell may provide power directly to at least a portion of load 305 as illustrated, while in other embodiments, power to load 305 may be provided to load 305 via all batteries 301a-c in series. Load 305 represents any circuit receiving power from batteries 301a-c and may correspond to any number of circuits and devices used in a portable computing system.

BMCs 302a-c manage the performance of each corresponding battery 301a-c. In other words, BMC 302a manages battery 301a, BMC 302b manages battery 301b, and BMC 302c manages battery 301c. Each BMC 302a-c receives power from the respective battery 301a-c that the BMC is monitoring. Since batteries 301a-c are arranged in series, each BMC 302a-c may be operating with a different supply voltage level as well as a different common mode voltage level. For example, the common mode voltage level for BMC 302b is the same as the supply voltage level for BMC 302a. Likewise, the supply voltage level for BMC 302b is the same as the common mode voltage level of BMC 302c.

BMCs 302a-c may manage the performance of their respective battery similar to the description for BMC 102 in FIG. 1, i.e., by measuring and tracking current and/or charge supplied to load 305. Each BMC 302a-c may also measure and track a recharging current into batteries 301a-c. BMC 302c measures current/charge using sensor element 303. As with sensor element 103, sensor element 303 may be a component or circuit capable of sensing a direction and magnitude of current.

Similar to the description of FET 104 in FIG. 1, BMC 302c turns FET 304 on and off. FET 304 may be used as a power switch to allow current to pass from batteries 301a-c to load 305. Current from batteries 301a-c may flow through the sensor element 303 whenever FET 304 is turned on, either for supplying power from, or charging batteries 301a-c. Although FET 304 is illustrated and described as a field effect transistor, in other embodiments, any other suitable type of transistor may be used and, in some embodiments, FET 304 may correspond to multiple transistors.

Each BMC 302a-c maintains information on the operation of the respective battery 301a-c, such as, for example, average and peak supply currents, average and peak recharging currents, current charge level, current voltage level, a number of recharging cycles, a time since the last charging cycle, or any other relevant information on the respective battery 301a-c. BMCs 302a-c may share some or all information with host 320. Host 320 may be a main processor in the computing system, or a part of a system management unit used to monitor and control hardware in the computing system. Host 320 may also be a part of load 305, i.e., may be powered by one or more of batteries 301a-c. In the illustrated embodiment, host 320 is coupled to communicate with the BMC monitoring the bottom cell, i.e., BMC 302a. BMC 302a is coupled to communicate with BMC 302b and BMC 302b is subsequently coupled to communicate with BMC 302c. These serialized connections allow host 320 to communicate with each of BMCs 302a-c.

To facilitate communication amongst each BMC 302a-c and host 320, each BMC 302a-c includes a respective clock circuit 310 and data circuit 312. Clock circuits 310a-c and data circuits 312a-c are part of a communication block, such as communication block 205 in FIG. 2. Since each BMC 302a-c is operating with a difference supply voltage level and common mode voltage level, as previously described, a standard communication protocol between the BMCs may not function properly without level shifting circuits between each clock circuit 310a-c and each data circuit 312a-c. Communication protocols such as I²C, SPI, and UART typically rely on at least a single common mode voltage to transmit and receive signals between transceivers without the level shifting circuits.

To communicate between each BMC 302a-c, clock circuits 310a-c and data circuits 312a-c support a communication protocol using current levels rather than voltage levels to indicate values of data bits. Clock circuits 310a-c and data circuits 312a-c are designed to transmit data by sourcing or sinking a predetermined amount of current to indicate a data value. Since current flows from a higher voltage level to a lower voltage level, whether the communication block of a given BMC 302a-c sources or sinks current is dependent upon from which battery 301a-c the given BMC 302a-c is receiving power. For example, for BMC 302b to communicate to BMC 302a, BMC 302b will source various current levels via comms clock 330ab and comms data 332ab. Conversely, BMC 302b will sink currents via comms clock 330bc and comms data 332bc to communicate to BMC 302c. By using current levels rather than voltage levels to indicate data values, BMCs 302a-c may communicate amongst each other despite a lack of a single supply voltage level or common mode voltage level.

It is noted that as used herein, current is defined as flowing from a node with a higher voltage level to a node with a lower voltage level, i.e., in the opposite direction as the flow of electrons. Accordingly, as used herein, "sourcing a current" refers to enabling a path from a given node to another node with a higher voltage level, and "sinking a current" refers to enabling a path from the given node to another node with a lower voltage level.

To communicate with host 320, the communication block of BMC 302a uses a standard communication protocol such as I²C, SPI, or UART. Since BMC 302a is powered from the bottom cell, host 320 and BMC 302a may share a single common mode voltage level, although each may still have a different supply voltage level. Even in an embodiment with different supply voltage levels, BMC 302a and host 320 may communicate via a standard communication protocol (such as I²C, for example) using open-drain signals without level shifting circuits. In other embodiments, host 320 may also be capable of transmitting data by sourcing or sinking current to indicate a data value.

To communicate with each BMC 302a-c, host 320 sends commands to BMC 302a via host data 327, synchronized to host clock 325. The communications block of BMC 302a may be capable of recognizing a unique address or identification value assigned to each BMC 302a-c. Host 320 may include the address of a target BMC 302a-c for which the command is intended. BMC 302a may propagate the command up to BMC 302b if BMC 302a is not the target or block propagation of the command if BMC 302a is the target for the command. BMC 302b may propagate commands in a similar fashion such that the BMC for the top cell, BMC 302c, only receives commands for which it is the target.

In the present embodiment, BMC 302a transmits data to BMC 302b via chip-to-chip comms data 332ab synchronized with a clock signal on chip-to-chip comms clock 330ab. The clock signal may be generated independently within BMC 302a or may be synchronized to a clock signal from host 320, such as host clock 325. Since BMC 302a is coupled to host 320, clock circuit 310a may provide a master clock for all communication among BMCs 302a-c. Clock circuit 310a generates the clock signal by periodically toggling comms clock 330ab between two current sink values. In some embodiments, a "low" or "0" bit value may be represented by a zero or near zero sink current and a "high" 0 or "1" bit value by a higher sink current value, such as, for example, 1 mA. In other embodiments, any suitable currents may be used, including a current for a low bit value that is greater than the current for a high bit value. In various embodiments, the clock signal may run continuously, providing a synchronized timing signal to all BMCs 302a-c, or may only be transmitted when BMC 302a is transmitting data or when BMC 302a is expecting data from either BMC 302b or BMC 302c.

To transmit the data to BMC 302b, data circuit 312a may use similar sink current values as clock circuit 310a to indicate highs and lows. In other embodiments, data circuit 312a may use more than two sink current values in order to indicate more than a single bit value at a time. For example, two data bits may be transmitted together using four sink current values, such as, e.g., a near zero current for "00," 1 mA for "01," 2 mA for "02," and 3 mA to indicate "11." Data circuit 312a synchronizes data to periods of the clock signal by driving a next data bit value on comms data 332ab in response to a rising transition of the clock signal. In other embodiments, next data may be driven in response to a falling transition instead. Data circuit 312b reads the data bit value on comms data 332ab in response to a falling transition on the comms clock 330ab (or on a rising transition if data is driven in response to falling transitions).

It is noted that a "clock transition," as used herein (which may also be referred to as a "clock edge") refers to a clock signal changing from a first logic value to a second logic value. A clock transition may be "rising" if the clock signal goes from a low value to a high value, and "falling" if the clock signal goes from a high to a low.

Upon receiving a command, BMC 302b or BMC 302c may be expected to reply with one or more data values. For example, BMC 302c may receive a command originating from host 320 to return a value corresponding to a current charge remaining in battery 301c. After the command is transmitted through BMCs 302a and 302b, BMC 302c may determine the value for the response and transmit the data value back through BMC 302b, and BMC 302a. Once a data value is ready to transmit, data 312c sources a predetermined current corresponding to a data bit value being sent in response to a rising transition on comms clock 330bc. As described above for data circuit 312a, data circuit 312c may source one of two currents to indicate a value of a single data bit at a time, or may source one of more than two currents to indicate values of more than one data bit at a time.

Since clock circuit 310a is the master clock source for BMC communication, clock circuit 310a may kee the clock signal active after the command has been transmitted. Clock circuit 310a may disable the clock signal in response to a determination that the reply data has been received, for example, by receiving a predetermined "command complete" data value. In other embodiments, clock circuit 310a may keep the clock signal active for a predetermined amount of time dependent upon the transmitted command. The reply data is received by data 312a via data 312b. Upon receiving the reply data, the communication block in BMC 302a transmits the reply to host 320 using the standard communication protocol.

It is noted that the block diagram of FIG. 3 is merely an example for demonstrating the disclosed concepts. Any suitable number of batteries may be included with a corresponding number of battery management circuits. In other embodiments, each battery 301 may include more than one battery cell in any suitable arrangement. Although values of data bits are described as corresponding to one of a number of predetermined currents, it is noted that various parameters such as, e.g., operating voltages, temperatures, IC manufacturing processes, etc., may cause actual current values to deviate from their pre-determined values. Pre-defined values may be selected to account for such deviations.

Figure 4:
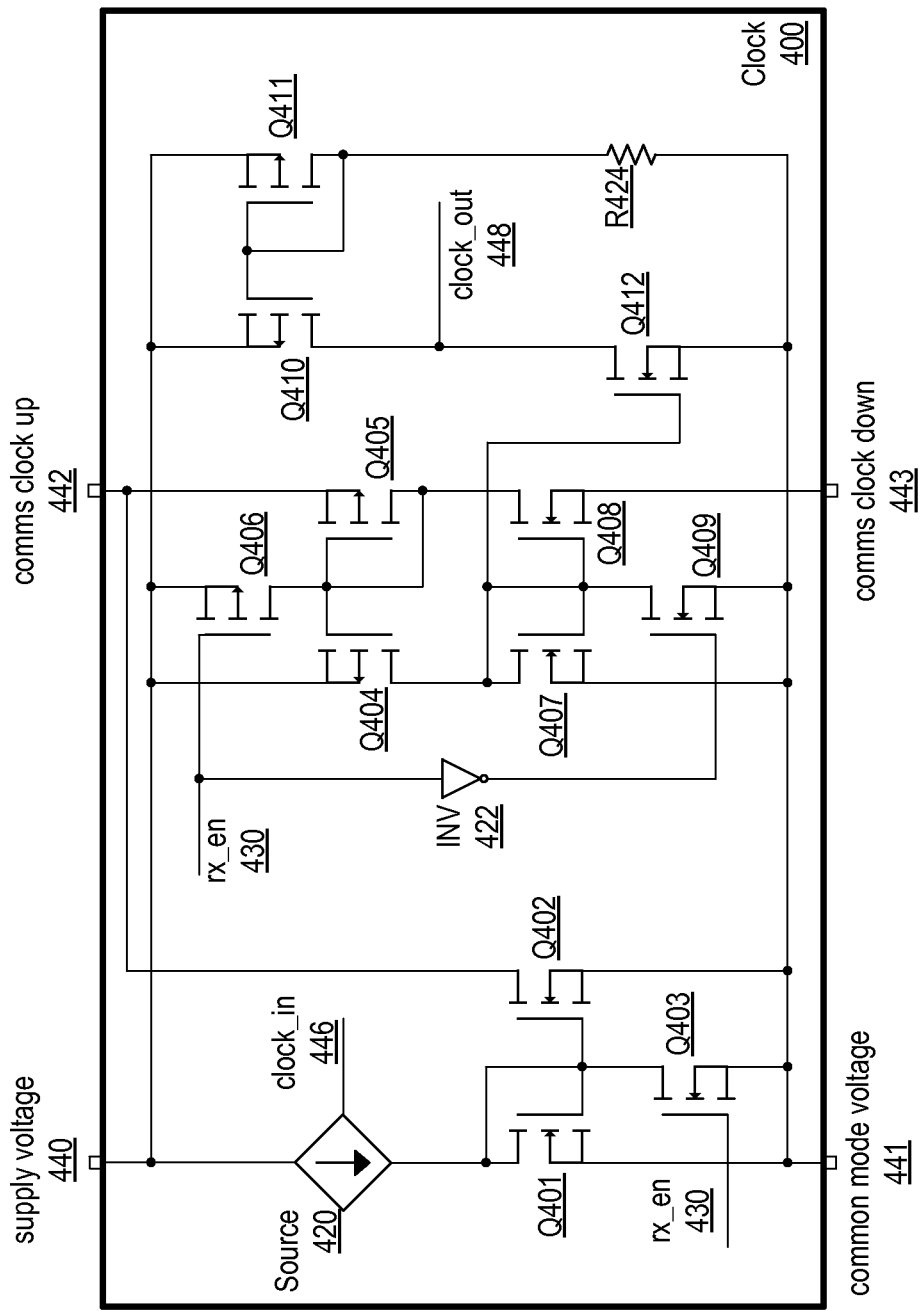
FIG. 4 illustrates a clock circuit for an embodiment of a communication circuit.

Moving now to FIG. 4, a clock circuit for an embodiment of a communication circuit is illustrated. Clock circuit 400 may correspond to each of clock circuits 310a-c in FIG. 3 and, therefore, be a subsystem of a battery management circuit such as each of BMC 302a-c. Clock circuit 400 includes transistors Q401 through Q412, variable current source (source) 420, inverter (INV) 422, and resistor R424. Clock circuit 400 also includes internal signals receive enable (rx_en) 430, clock in 446, and clock out 448, as well as external signals supply voltage 440, common mode voltage 441, communication (comms) clock up 442 and communication (comms) clock down 443.

In this embodiment, clock circuit 400 includes circuits for both receiving and transmitting a clock signal in the communication protocol described in FIG. 3. To enable the transmitting portion of clock circuit 400, rx_en 430 may be low, turning n-channel Q403 off and allowing the voltage on the gates of n-channel transistors Q401 and Q402 to be determined dependent upon a current value from current source 420. The low value of rx_en 430 also turns p-channel Q406 on, pulling the gates of p-channel transistors Q404 and Q405 high, thereby turning them off. INV 422 outputs a high in response to the low state of rx_en 430, turning n-channel Q409 on, pulling the gates of n-channel transistors Q407 and Q408 low, thereby turning them off as well. With Q404, Q405, Q407 and Q408 off, the receiving portion of clock circuit 400 is disabled.

Enabling the receiving portion of clock circuit 400, in the illustrated embodiment, is performed if rx_en 430 is high instead of low. The high value of rx_en 430 turns Q403 on, pulling the gates of Q401 and Q402 low and thereby turning Q401 and Q402 off. With Q401 and Q402 off, the transmitting portion of clock circuit 400 is disabled. In addition, the high state of rx_en turns Q406 off and (after inverting to a low signal) Q409 off. Currents through Q404, Q405, Q407 and Q408 are therefore determined by their respective gate-to-source voltages, enabling the receiving portion of clock circuit 400.

To transmit a clock signal, such as described above for BMC 302a, transistors Q401, Q402, and Q403 are used in conjunction with variable current source 420 in the present embodiment. Rx_en 430 is put into a low state by control circuits in BMC302a. A clock signal is received as clock_in 446. Clock_in 446 may be received from an external source, such as host 320, or may be generated within BMC 302a. Clock_in 446 is coupled to a voltage controlled input of current source 420, such that, when clock_in 446 is low, a first current value is sourced and when clock_in is high, a second current value is sourced. Q401 turns on enough to allow a current to pass that is approximately equal to the current value from current source 420. Since the gate of Q402 is connected to the gate of Q401 and the source for both transistors is coupled to common mode voltage 441, Q402 also turns on enough to allow a current to pass that is approximately equal to the current value from current source 420. The drain of Q402 is coupled to comms clock up 442, which is a signal external to BMC 302a. Referring to FIG. 3, comms clock up 442 of BMC 302a corresponds to node comms clock 330ab. The current value corresponding to the present state of clock in 446 is, therefore, drawn from clock circuit 310b in BMC 302b.

To receive a clock signal, such as described above for BMC 302b, rx_en 430 is put into a high state by control circuits in BMC 302b. Comms clock down 443 also corresponds to node comms clock ab in FIG. 3, i.e., comms clock down 443 of BMC 302b is connected to comms clock up 442 of BMC 302a. With BMC 302a transmitting a clock signal on comms clock 330ab, a sink current corresponding to a state of the clock signal pulls the voltage level at the source of Q408, creating a gate-to-source voltage on Q408 and drawing current though Q408 equal to the sink current value from BMC 302a. The current though Q408 is mirrored through Q405 and will be drawn from comms clock up 442. The voltage on the gate of Q408 and Q407 causes Q407 to turn on. Since the source nodes for Q407 and Q408 are not coupled, the amount of current passing through Q407 may not be equal to the current passing through Q408. The current through Q407, however, is dependent upon the current through Q408 and, therefore, dependent upon the sink current value through comms clock 330ab. The sink current through Q405 similarly creates a voltage at its gate that turns Q404 on in a similar manner as Q407 such that both transistors pass an equal current. Since the gate and source nodes of Q412 are coupled to the gate and source nodes of Q407, respectively, Q412 mirrors the current through Q407.

It is noted that as referred to herein "current mirroring" or a "current mirror" refers to circuitry designed to sense a current passing through a first portion of the circuitry and reproduce a similar amount of current in a second portion of the circuitry. The reproduced current occurs at substantially the same time as the sensed current. The reproduced current may be coupled to other circuits without adding impedance to the sensed current.

Meanwhile, the coupling of p-channel transistor Q411 and resistor R424 creates a current through Q411. This current is used as a reference current and is mirrored in Q410 since the gate and drain nodes of Q410 are respectively coupled to the gate and drain nodes of Q411. A resistance value of resistor 424 may be selected to generate a pre-determined reference current value. Since the drain node of Q412 is coupled to the source node of Q410, the state of the received clock signal, clock out 448, is high when the current through Q412 is lower than the reference current and is low when the current through Q412 is higher than the reference current.

Clock circuit 400 propagates a clock signal received at comms clock down 443 at comms clock up 442. Since Q405 mirrors the current through Q408, the amount of sink current being drawn out comms clock down 443 is equal to a current being pulled in from comms clock up 442. Referring again to FIG. 3, comms clock up 442 of BMC 302b is connected to a same node as comms clock down 443 of BMC 302c. BMC 302c therefore, receives the clock signal from BMC 302a with little to no latency as compared to BMC 302b. Since BMC 302c is coupled to the top cell, no additional BMC may be coupled and comms clock up of BMC 442 may be connected to supply voltage 440 of BMC 302c.

It is noted that clock circuit 400 of FIG. 4 merely illustrates an example embodiment of a clock circuit. Only the components necessary to demonstrate the disclosed concepts are shown. In other embodiments, additional components may be included. The components shown in FIG. 4 are not intended to illustrate physical locations or sizes of components used in actual circuits.

Figure 5:
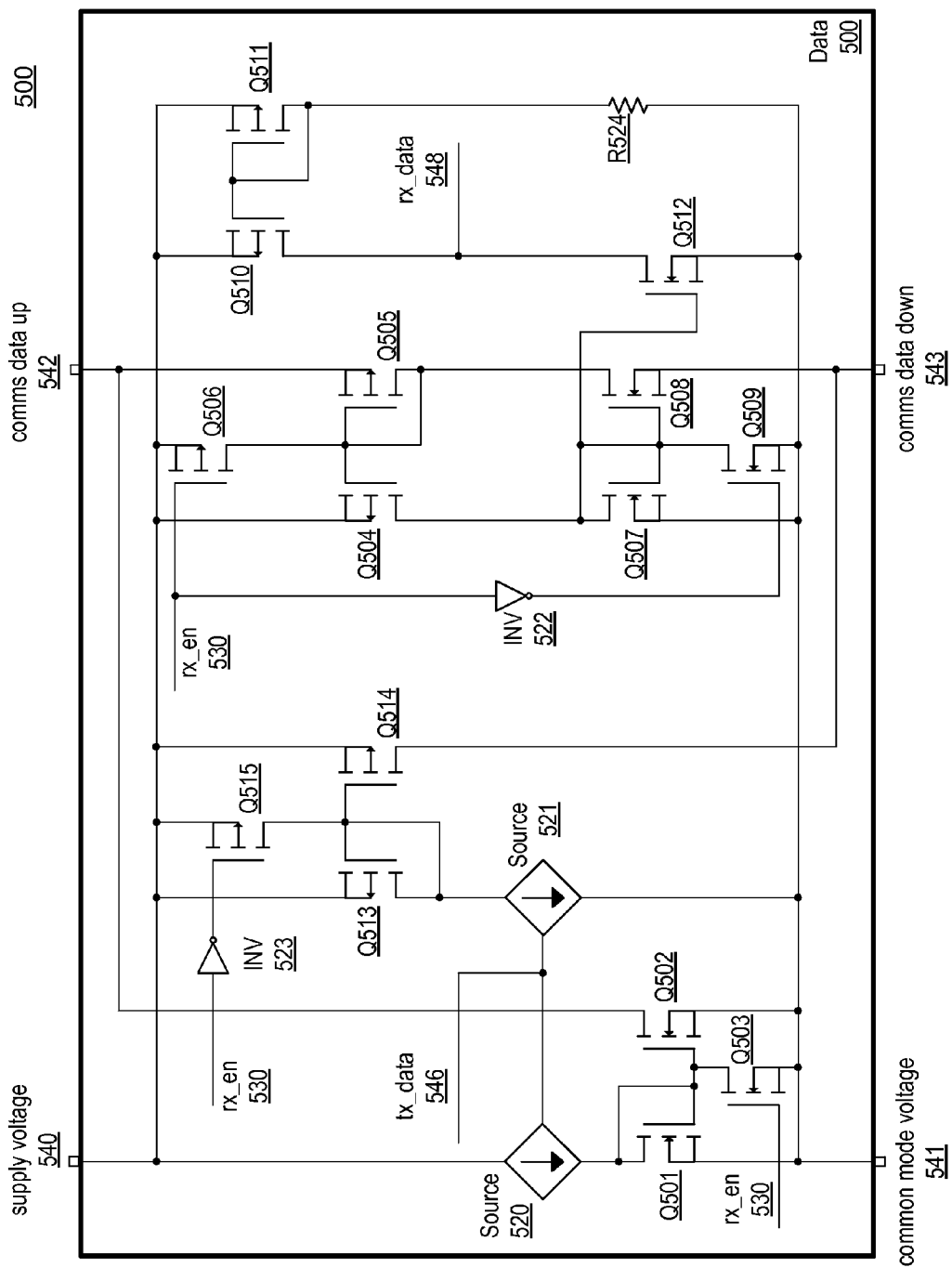
FIG. 5 illustrates a data transceiver circuit for an embodiment of a communication circuit.

Turning now to FIG. 5, a data transceiver circuit for an embodiment of a communication circuit is shown. Data circuit 500 may correspond to each of data circuits 312a-c in FIG. 3 and, therefore, be a subsystem of a battery management circuit such as each of BMC 302a-c. Data circuit 500 includes transistors Q501 through Q515, variable current sources (source) 520 and 521, inverters (INV) 522 and 523, and resistor R424. Clock circuit 500 also includes internal signals receive enable (rx_en) 530, clock_in 546, and clock_out 548, as well as external signals supply voltage 540, common mode voltage 541, communication (comms) clock up 542 and communication (comms) clock down 543. Data circuit 500 is similar in composition and in function to clock circuit 400 in FIG. 4. Operation of data circuit 500 is, therefore, as described above in regards to FIG. 4 with exceptions noted below.

Data circuit 500 transmits data in much the same manner that clock circuit 400 transmits a clock signal. One difference however, is that, in the previously disclosed embodiments, the clock signal is unidirectional. I.e., clock circuit 400 only transmits a clock signal out the comms clock up node, not the comms clock down node, since (referring to FIG. 3) BMC 302a provides the master clock signal to clock circuits in BMC 302b and BMC 302c. The data signal, however, is bi-directional, and therefore, additional circuitry is used to enable transmission of a data signal out both comms data up 542 and comms data down 543.

Using BMC 302b as an example, to transmit data, control circuits in BMC 302b set rx_en 530 (which may correspond to rx_en 430 in some embodiments) to a low state, thereby enabling the transmitting circuits and disabling the receiving circuits. Variable current source 520, Q501 and Q502 operate as described above for current source 420, Q401 and Q402 and output data on comms data up 542. In parallel with data sent via comms data up 542, variable current source 521, Q513, and Q514 output the same data through comms data down 543. The low state of rx_en 530 is inverted to a high state by INV 523 which turns Q515 off. Data signal tx_data 546 drives a voltage controlled input of current source 521 which in turn, forces a current through Q513. In the illustrated embodiment, data is transmitted one bit at a time, using two current values. As previously described, however, in other embodiments, more than two current values may be used to send multiple data bits in parallel. The current through Q513 is mirrored in Q514 which sources the current to comms data down 543.

Receiving data via comms data down 543 is as described above in regards to FIG. 4. Receiving data via comms data up 542 occurs in a similar manner. When BMC 302c is transmitting data, control logic in BMC 302b sets rx_en 530 to a high state, turning both Q503 and Q515, thereby disabling the transmitting circuits. In addition, the high state of rx_en 530 turns Q506 and Q509 off, enabling the receiving circuits. The transmitting circuits of BMC 302c source a current corresponding to a data bit being sent. The sourced current forces a current through Q505 and Q508 and out comms data down 543. This current through Q505 generates a voltage at its gate, which is also coupled to the gate of Q504. Since the drains of Q505 and Q504 are not coupled to the same node, Q504 passes a current that may not be the same as the current through Q505 but that is dependent upon the Q505 current. The current through Q504 causes an equal current through Q507. Q512 mirrors the current through Q504. As described for Q410, Q411, and resistor R424 in FIG. 4, Q510, Q511, and resistor R524 generate a reference current through Q510. If the current through Q512 is less than the reference current, then rx_data 548 goes to a high state and conversely, if the current through Q512 is greater than the reference current, then rx_data 548 goes to a low state.

In other embodiments, rx_en 530 may be combined with another control signal such that data transmission via comms data up 542 and comms data down 543 may be enabled individually. For example, during transmission of a command from BMC 302a to BMC 302c, BMC 302a may enable the transmitting circuits to send data out of its respective comms data up 542 node. BMC 302b receives the data at its respective comms data down 543 node while simultaneously sending the data at its respective comms data up 542 node. BMC 302c receives the data at its respective comms data down 543 node. In his scenario, BMC 302a does not need to send data via its comms data down 543 node since no BMC is coupled to this node and can therefore disable the circuitry sending data out this node. Conversely, to respond to the received command, BMC 302c sends data via its comms data down 543 node to BMC 302b which passes the data to BMC 302a. Since BMC 302c has no BMC coupled to its comms data up 542 node, control circuits in BMC 302c may disable the associated transmitting circuitry.

It is noted that data circuit 500 of FIG. 5 is merely an example of a data transceiver circuit. The circuit diagram of FIG. 5 has been simplified to highlight features relevant to this disclosure. In other embodiments, additional components may be included, such as circuitry to combine rx_en 530 with one or more additional enable signals. The components shown in FIG. 5 are not intended to illustrate physical locations or sizes of components used in actual circuits.

Figure 6:
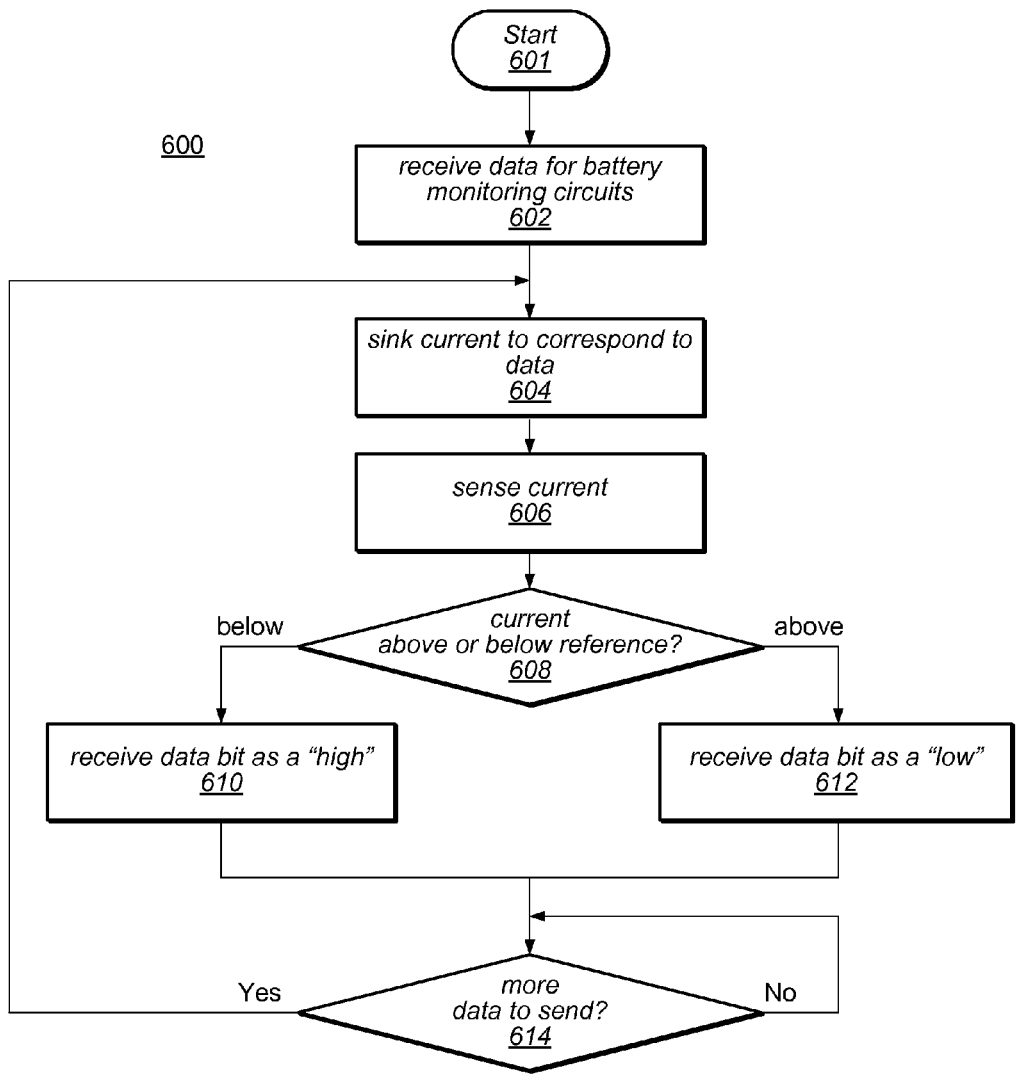
FIG. 6 shows a flowchart illustrating an embodiment of a method for transmitting a command across voltage domains.

Moving to FIG. 6, a flowchart illustrating an embodiment of a method for transmitting a command across voltage domains is shown. The method may be applied to a battery management circuit, such as, for example, BMCs 302a in FIG. 3. Referring collectively to system 300 of FIG. 3, and the flowchart in FIG. 6, the method begins in block 601.

BMC 302a receives a clock signal and a data signal to be forwarded to BMC 302b (block 602). The clock signal and data may be received from another processor in system 300, such as, for example, host 320. The data may include a command for one battery management circuit, such as BMC 302c, or all BMCs 302a-c.

BMC 302a sinks a current with a value corresponding to a first data bit of the data (block 604). A clock circuit, such as clock circuit 310a, sinks a first clock current corresponding to a first phase of a clock signal. A data circuit, such as data circuit 312a, sinks a first data current with corresponding to a first data bit in response to clock circuit 310a sinking the first clock current. In the present embodiment, clock circuit 310a and data circuit 312i a sink similar currents to represent a logic high or a logic low. In other embodiments, clock circuit 310a and data circuit 312a may sink different values of current for each logic state. In further embodiments, data circuit 312a may sink one of more than two values of current to represent more than one bit of data in a single clock cycle. After data circuit 312a begins sinking the first data current, clock circuit 310a sinks a second clock current corresponding to a second phase of the clock signal.

BMC 302b senses the currents from BMC 302a (block 606). Clock circuit 310b may sense the first and second clock currents from clock circuit 310a and data circuit 312b may sense the first data current from data circuit 312a. Data circuit 312b may sense the first data current in response to detecting a transition from the first clock current to the second clock current.

It is noted that BMC 302c may sense the currents sank by BMC 302a in parallel with BMC 302b, using the same method. In other words, the clock currents and data currents being sunk by BMC 302a may observable by both BMC 302b and BMC 302c with little to no latency between the two. As used herein, "parallel" refers to operations or actions occurring at overlapping periods of time. Operations occurring in "parallel" do not necessarily begin and end at precisely the same times.

Further operations of the method may depend on a comparison of the sink current to a reference current (block 608). Clock circuit 310b senses the first clock current through one or more transistors coupled to clock circuit 310a through a common node. The current may be reproduced using a current mirroring circuit as described above in regards to FIG. 4 and FIG. 5. The reproduced current is compared to a reference current to determine a corresponding logic state for the clock signal. Data circuit 312b may use a similar technique to determine a corresponding value of the data bit received from data circuit 312a. If a magnitude of the sensed current is greater than a magnitude of the reference current, then the method moves to block 612. Otherwise, the method moves to block 610.

If the sensed current is less than the reference current, then the received signal is determined to be in a logic high state (block 610). Transistors in clock circuit 310b drive a high voltage level in response to the received current being less than the reference current. Similar transistors in data circuit 312b perform the same function. The high voltage level represents a logic high value. At this point, the received clock signal and data bit may be usable by CMOS logic within BMC 302b.

If the sensed current is greater than the reference current, then the received signal is determined to be in a logic low state (block 612). The same transistors that drive the high voltage level, as described in block 610, drive a low voltage level in response to the received current being less than the reference current. The low voltage level represents a logic low value and the received data bit may now be usable by CMOS logic within BMC 302b.

Subsequent operations of the method may depend on a determination of more data to send (block 614). Logic in BMC 302a determines if more data bits are ready to be sent. If more data is ready, then clock circuit 310a sinks the first clock current again to begin a next clock cycle and data circuit 312a sinks a second data current corresponding to the value of the next data bit. If no further data is ready for transmission, then the method remains in block 614 to wait for more data to send.

It is noted that the method illustrated in FIG. 6 is merely an example embodiment. Variations on this method are possible and contemplated for example, some operations may be performed in a different sequence, and/or additional operations may be included.

Figure 7:
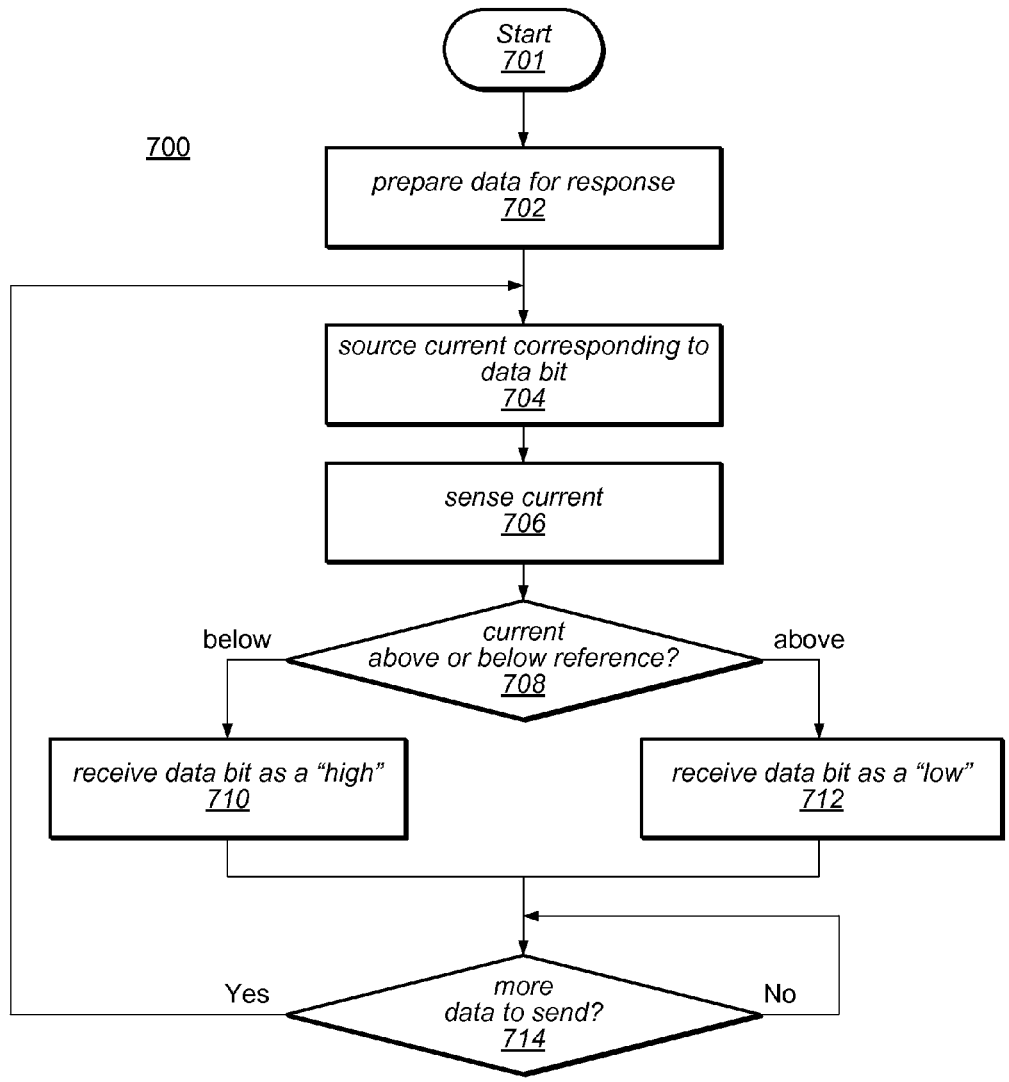
FIG. 7 illustrates a flowchart for an embodiment of a method for transmitting a response to a command across voltage domains.

Turning now to FIG. 7, a flowchart illustrating an embodiment of a method for transmitting a response to a command across voltage domains is shown. The method may be applied to a battery management circuit, such as, for example, BMCs 302c in FIG. 3. Referring collectively to system 300 of FIG. 3, and the flowchart in FIG. 7, the method begins in block 701.

BMC 302c prepares a response to a previously received command (block 702). BMC 302c may receive a command from Host 320 via BCM 302a and BMC 302b. The command may correspond to an instruction to initialize a setting or a request for data from BMC 302c. A response may be expected, such as an acknowledgement that the setting has been initialized, or transmission of the requested data.

BMC 302c sources a current corresponding to a data bit of the response (block 704). BMC 302c communicates to host 320 by sending data to BMC 302a. BMC 302a may then communicate to host 320 using a different communication interface, such as, for example, I²C. After sending a command to BMC 302b or BMC 302c, BMC 302a may continue to transmit a clock signal for use by BMC 302b or BMC 302c in transmitting the response. In response to determining the clock signal has transitioned from a second clock current to a first clock current (as described above for FIG. 6), thereby indicating a start of a next clock cycle, data circuit 312c sources a first data current corresponding to a value of a data bit of the response. The first data current sourced by data circuit 312c may be similar to the first data current sank by data circuit 312a as described for FIG. 6. In other embodiments, currents sourced by a given data circuit may have different values than the currents sank.

It is noted that although currents may be described as being similar, a variety of parameters may cause deviations in respective current values. For example, operating voltages, temperatures, IC manufacturing processes, etc., may cause two similar circuits to produce different currents although the circuits may be designed to produce similar current values. Systems may be designed to tolerate a predetermined amount of deviation in the currents and maintain proper operation. Such tolerances may be referred to as "design margins."

BMC 302a senses the first data current from BMC 302c (block 706). The current sourced by data circuit 312c may be sensed by data circuit 312b and data circuit 312a in parallel. In some embodiments, data circuit 312b may determine that the command received by BMC 302c was not intended for BMC 302b and that the corresponding response to the command is not intended for BMC 302b. In such embodiments, data circuit 312b may not sense the sourced current from data circuit 312c. BMC 302a receives the sourced current via a same node that data circuit 312i a uses to sink current for transmitting data. In other words, in the illustrated embodiment, the data circuits 312a-c are coupled via bi-directional nodes.

Further operations of the method may depend on a comparison of the sourced current to a reference current (block 708). Data circuit 312a senses the sourced current through one or more transistors coupled to data circuit 312c (via data circuit 312b) through common nodes. The sourced current may be reproduced in data circuit 312a using a current mirroring circuit as previously described. The reproduced current is compared to a reference current to determine a corresponding logic state for the clock signal. In some embodiments, the reference current that is compared to a source current may be similar to the reference current that is compared to a sink current as described above in regards to block 608 of FIG. 6. In other embodiments, the reference current may be adjusted for comparisons dependent upon if the current being sensed is a source current or sink current. If a magnitude of the sensed current is greater than a magnitude of the reference current, then the method moves to block 712. Otherwise, the method moves to block 710.

If the sensed current is less than the reference current, then the sourced current is determined to be a logic high value (block 710). Transistors in clock circuit 310a drive a high voltage level in response to the received current being less than the reference current. The high voltage level represents a logic high value. At this point, the received clock signal and data bit may be usable by CMOS logic within BMC 302a.

If the sensed current is greater than the reference current, then the received signal is determined to be in a logic low state (block 712). The same transistors that drive the high voltage level, as described in block 710, drive a low voltage level in response to the received current being less than the reference current. The low voltage level represents a logic low value and the received data bit may now be usable by CMOS logic within BMC 302a.

Subsequent operations of the method may depend on a determination that the response includes more data to send (block 714). Logic in BMC 302c determines if the response includes a next data bit. If another data bit is ready, then BMC 302c determines when a next transition occurs from the second clock current to the first clock current, indicating the start of a next clock cycle. In response, data circuit 312c sources a second data current corresponding to the value of the next data bit. If no further data is ready for transmission, then the method remains in block 714 to wait for more data to send.

It is noted that the method illustrated in FIG. 7 is an example for demonstrating the disclosed concepts. In various embodiments, some operations may be performed in a different sequence, and/or additional operations may be included.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system comprising:
   a plurality of units, wherein each unit of the plurality of units has a respective common mode voltage terminal, a respective communication up terminal, and a respective communication down terminal;
   wherein a first unit of the plurality of units is configured to generate a first plurality of currents on the respective communication up terminal of the first unit, wherein each current of the first plurality of currents corresponds to a respective bit of a first plurality of bits;
   wherein a second unit of the plurality of units is configured to:
      receive the first plurality of currents on the respective communication down terminal of the second unit; and
      maintain a voltage level at the respective communication down terminal of the second unit during reception of the first plurality of currents, wherein the voltage level is equal to a common mode voltage of the respective common mode voltage terminal of the second unit.

2. The system of claim 1, wherein a respective supply voltage terminal of the first unit is coupled to a positive terminal of a first power supply, and wherein the respective common mode voltage terminal of the second unit is coupled to the positive terminal of the first power supply.

3. The system of claim 1, wherein the second unit is further configured to generate a second plurality of currents on the respective communication down terminal of the second unit, wherein each current of the second plurality of currents corresponds to a respective bit of a second plurality of bits.

4. The system of claim 3, wherein the first unit is further configured to:
receive the second plurality of currents on the respective communication up terminal of the first unit; and
maintain a respective voltage level of the respective communication up terminal of the first unit during reception of the second plurality of currents, wherein the respective voltage level is equal to a supply voltage level of a respective supply voltage terminal of the first unit.

5. The system of claim 1, wherein the respective communication up terminal of the second unit is coupled to the respective communication down terminal of a third unit of the plurality of units; and
wherein the third unit is configured to:
receive the first plurality of currents on the respective communication down terminal of the third unit; and
maintain a respective voltage level of the respective communication down terminal of the third unit during reception of the first plurality of currents, wherein the respective voltage level of the respective communication down terminal is equal to a common mode voltage of the respective common mode voltage terminal of the third unit.

6. The system of claim 1, wherein the first plurality of bits includes at least one command for the second unit.

7. The system of claim 1, wherein each bit of the first plurality of bits corresponds to a respective logic state of a clock signal.

8. A method, comprising:
generating, by a first circuit, a first plurality of currents at a first node coupled to the first circuit and a second circuit, wherein each current of the first plurality of currents corresponds to a respective bit of a first plurality of bits;
receiving, by the second circuit, the first plurality of currents at the first node; and
maintaining, by the second circuit, a voltage level of the first node while receiving the first plurality of currents, wherein the voltage level is equal to a common mode voltage of the second circuit.

9. The method of claim 8, further comprising:
supplying a voltage level at a power supply terminal of the first circuit; and
supplying the voltage level at a common mode terminal of the second circuit.

10. The method of claim 8, further comprising generating, by the second circuit, a second plurality of currents at the first node, wherein each current of the second plurality of currents corresponds to a respective bit of a second plurality of bits.

11. The method of claim 10, further comprising: p1 receiving, by the first circuit, the second plurality of currents at the first node; and p1 maintaining, by the first circuit, the voltage level of the first node while receiving the second plurality of currents, wherein the voltage level is equal to a supply voltage level of the first circuit.

12. The method of claim 8, further comprising:
receiving, by a third circuit, the first plurality of currents at a second node, wherein the second circuit is coupled to the second node; and
maintaining, by the third circuit, a respective voltage level at the second node while receiving the first plurality of currents, wherein the respective voltage level is equal to a common mode voltage of the third circuit.

13. The method of claim 8, wherein the first plurality of bits includes at least one command for the second circuit.

14. The method of claim 8, wherein each bit of the first plurality of bits corresponds to a respective logic state of a clock signal.

15. An apparatus, comprising:
a variable current source configured to encode a first plurality of bits, wherein each of the first plurality of bits is encoded by sourcing a respective one current value of a first set of current values;
a first current mirroring circuit configured to generate a second plurality of bits at a communication up node, wherein each of the second plurality of bits is encoded by sinking a respective one current value of a second set of current values, and wherein the second plurality of bits is dependent upon the first plurality of bits; and
a second current mirroring circuit configured to:
receive a third plurality of bits at the communication up node, wherein each of the third plurality of bits is encoded by sourcing a respective one current value of a third set of current values; and
maintain a voltage level at the communication up node while receiving the third plurality of bits, wherein the voltage level is equal to a supply voltage of a supply voltage node.

16. The apparatus of claim 15, wherein the second current mirroring circuit is further configured to:
receive a fourth plurality of bits at a communication down node, wherein each of the fourth plurality of bits is encoded by sinking a respective one current value of a fourth set of current values; and
maintain a respective voltage level at the communication down node while receiving the fourth plurality of bits, wherein the respective voltage level is equal to a common mode voltage of a common mode voltage node.

17. The apparatus of claim 15, wherein the first plurality of bits and the second plurality of bits include a command for a different circuit.

18. The apparatus of claim 17, wherein the third plurality of bits is received from the different circuit, and wherein the third plurality of bits includes at least one response to the command.

19. The apparatus of claim 15, wherein the first current mirroring circuit is disabled while the second current mirroring circuit is enabled, and wherein the second current mirroring circuit is disabled while the first current mirroring circuit is enabled.

20. The apparatus of claim 15, wherein the first plurality of bits and the second plurality of bits each correspond to a respective logic state of a clock signal.

* * * * *